United States Patent
Song (10) Patent No.: US 8,153,489 B2
(45) Date of Patent: Apr. 10, 2012

(54) METHOD FOR FABRICATING SEMICONDUCTOR DEVICE WITH BURIED GATES

(75) Inventor: Pil-Geun Song, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 103 days.

(21) Appl. No.: 12/824,900

(22) Filed: Jun. 28, 2010

(65) Prior Publication Data
US 2011/0003468 A1 Jan. 6, 2011

(30) Foreign Application Priority Data
Jul. 3, 2009 (KR) .................. 10-2009-0060642

(51) Int. Cl.
*H01L 29/80* (2006.01)
*H01L 31/112* (2006.01)
(52) U.S. Cl. .............. 438/259; 438/270; 257/E21.655
(58) Field of Classification Search ............ 438/259, 438/270, 271, 289; 257/E21.655
See application file for complete search history.

(56) References Cited

U.S. PATENT DOCUMENTS
7,037,788 B2 * 5/2006 Ito et al. .................. 438/268

FOREIGN PATENT DOCUMENTS
| KR | 1020070002688 | 1/2007 |
| KR | 1020080089095 | 10/2008 |
| KR | 1020090068542 | 6/2009 |

OTHER PUBLICATIONS

Notice of Allowance issued from Korean Intellectual Property Office on May 30, 2011.

* cited by examiner

*Primary Examiner* — Thanhha Pham
(74) *Attorney, Agent, or Firm* — IP & T Group LLP

(57) ABSTRACT

A method for fabricating a semiconductor device, including forming a trench by etching a semiconductor substrate, forming a gate insulation layer over a surface of the trench, forming a gate conductive layer over the gate insulation layer, performing a first recess process by etching the gate conductive layer, forming a protection pattern over the gate insulation layer, and performing a second recess process by etching the gate conductive layer.

20 Claims, 11 Drawing Sheets

METHOD FOR FABRICATING SEMICONDUCTOR DEVICE WITH BURIED GATES

CROSS-REFERENCE TO RELATED APPLICATIONS

The present application claims priority of Korean Patent Application No. 10-2009-0060642, filed on Jul. 3, 2009, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with buried gates.

As the sizes of semiconductor devices shrink, the structure of word lines is changed from a structure where the word lines are positioned in the upper portion of a silicon substrate to a structure where the word lines are positioned in the lower portion of a silicon substrate. This process of forming word lines in the lower portion of a silicon substrate is referred to as a buried gate process.

FIGS. 1A to 1E are cross-sectional views illustrating a conventional method for fabricating buried gates.

Figure 1A:
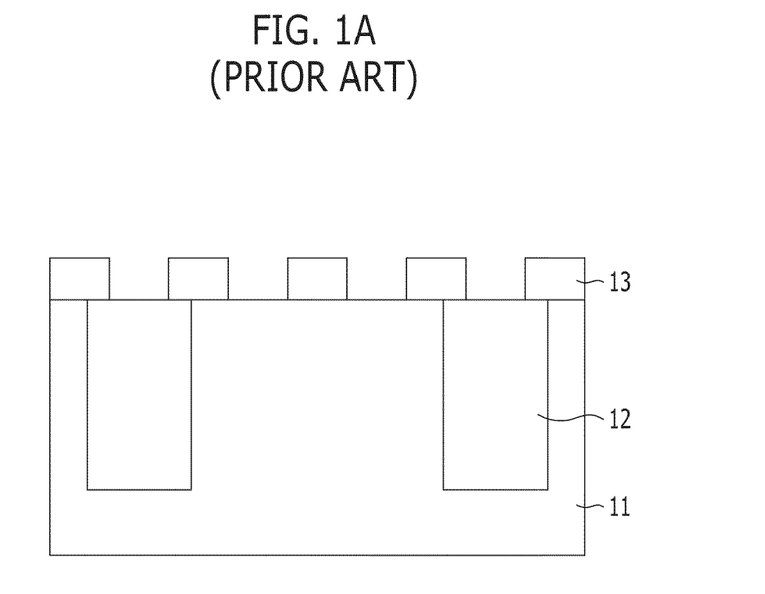
FIGS. 1A to 1E are cross-sectional views illustrating a conventional method for fabricating buried gates.

Referring to FIG. 1A, an isolation layer 12 is formed in a semiconductor substrate 11, and then a hard mask pattern 13 is formed.

Figure 1B:
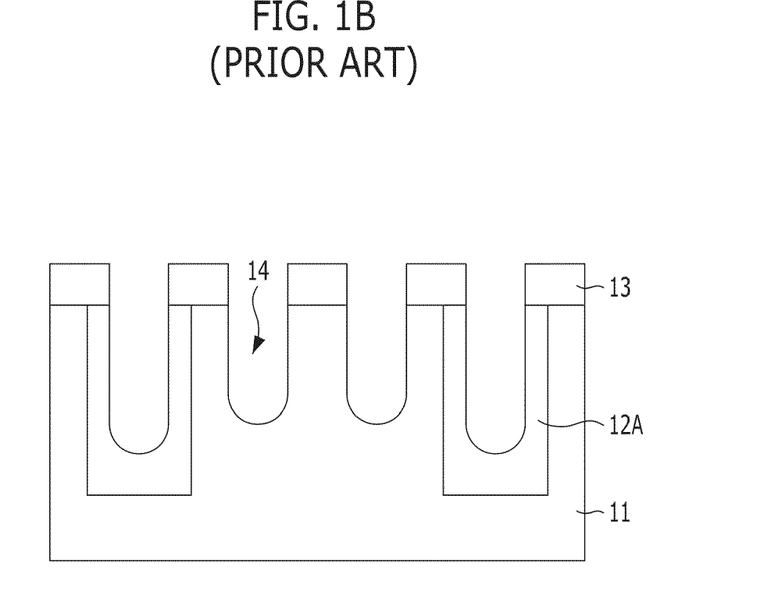

Referring to FIG. 1B, trenches 14 are formed by etching the semiconductor substrate 11 and the isolation layer 12 by using the hard mask pattern 13 as an etch barrier. Herein, the etched isolation layer 12 will be referred to as isolation pattern 12A.

Figure 1C:
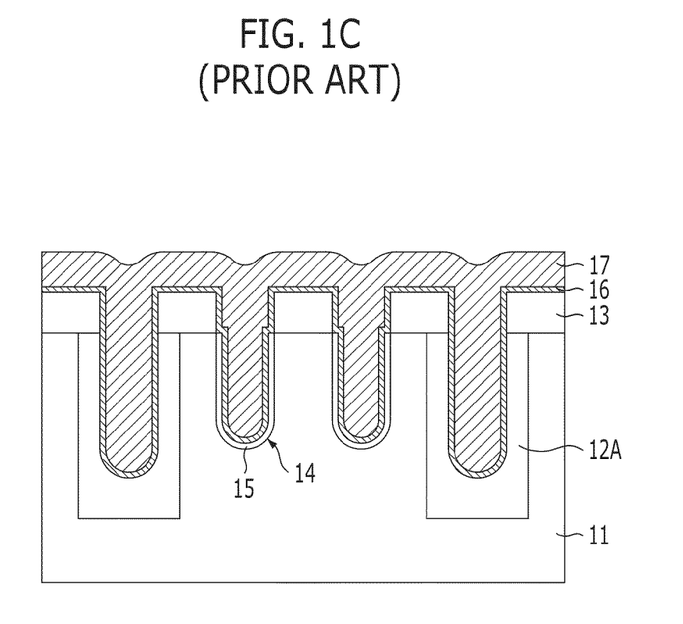

Referring to FIG. 1C, an oxidation process is performed to form a gate insulation layer 15, and then a titanium nitride layer 16 and a tungsten layer 17 are deposited as a gate conductive layer.

Figure 1D:
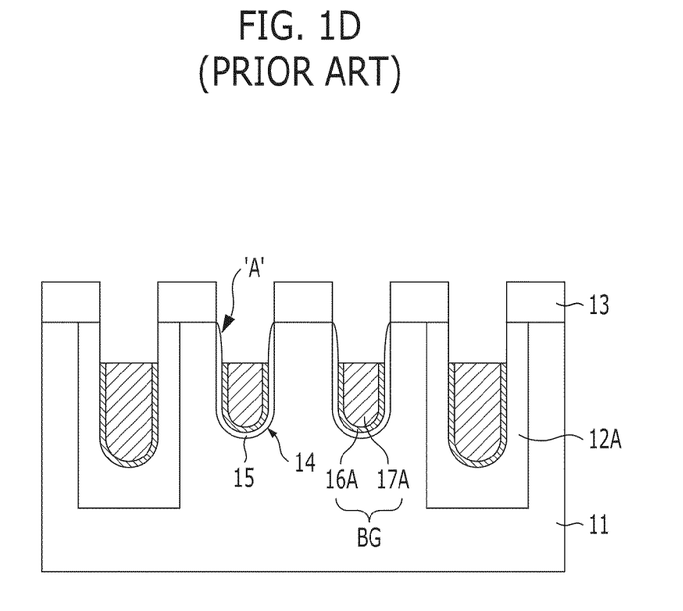

Referring to FIG. 1D, a chemical mechanical polishing (CMP) process is performed for planarization, and then buried gates (BG) are formed by recessing the titanium nitride layer 16 and the tungsten layer 17 to a predetermined depth through a plasma dry etch process. Herein, the recessed titanium nitride layer 16 and tungsten layer 17 will be referred to as titanium nitride pattern 16A and tungsten pattern 17A.

Figure 1E:
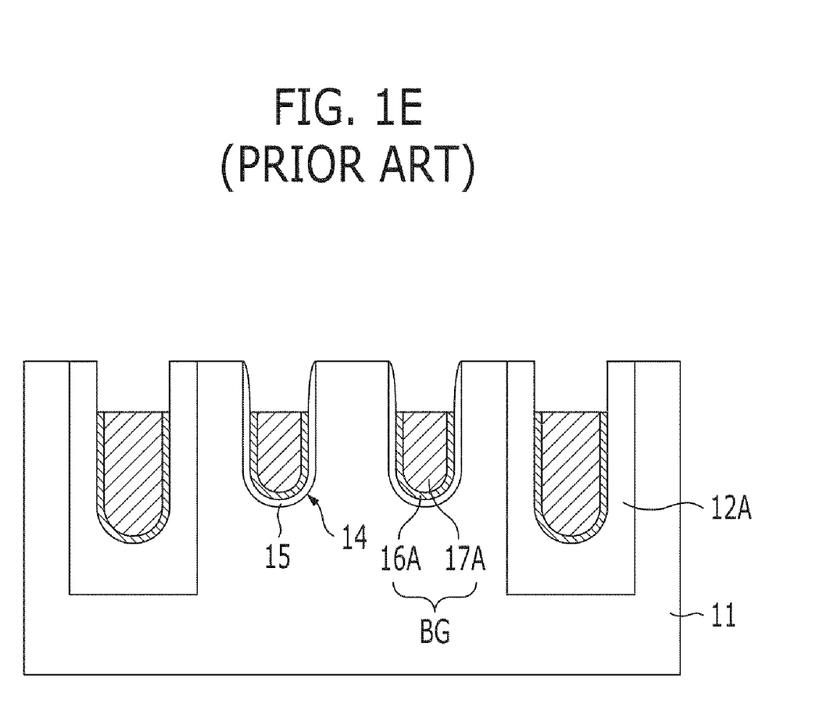

Referring to FIG. 1E, the hard mask pattern 13 is removed.

According to the above-described conventional method, however, the titanium nitride layer 16 and the tungsten layer 17 may be recessed at least approximately 600 Å to approximately 650 Å during the plasma dry etch process for forming the buried gates. Therefore, some of the gate insulation layer 15 may be lost during the plasma dry etch process.

In particular, the gate insulation layer 15 at the top corners of each trench may be over-etched (see reference symbol 'A' of FIG. 1D) during the plasma dry etch process. In other words, the remaining gate insulation layer at the top corners of each trench may become thinner, and thus the refresh characteristic of a semiconductor device may deteriorate.

Figure 2:
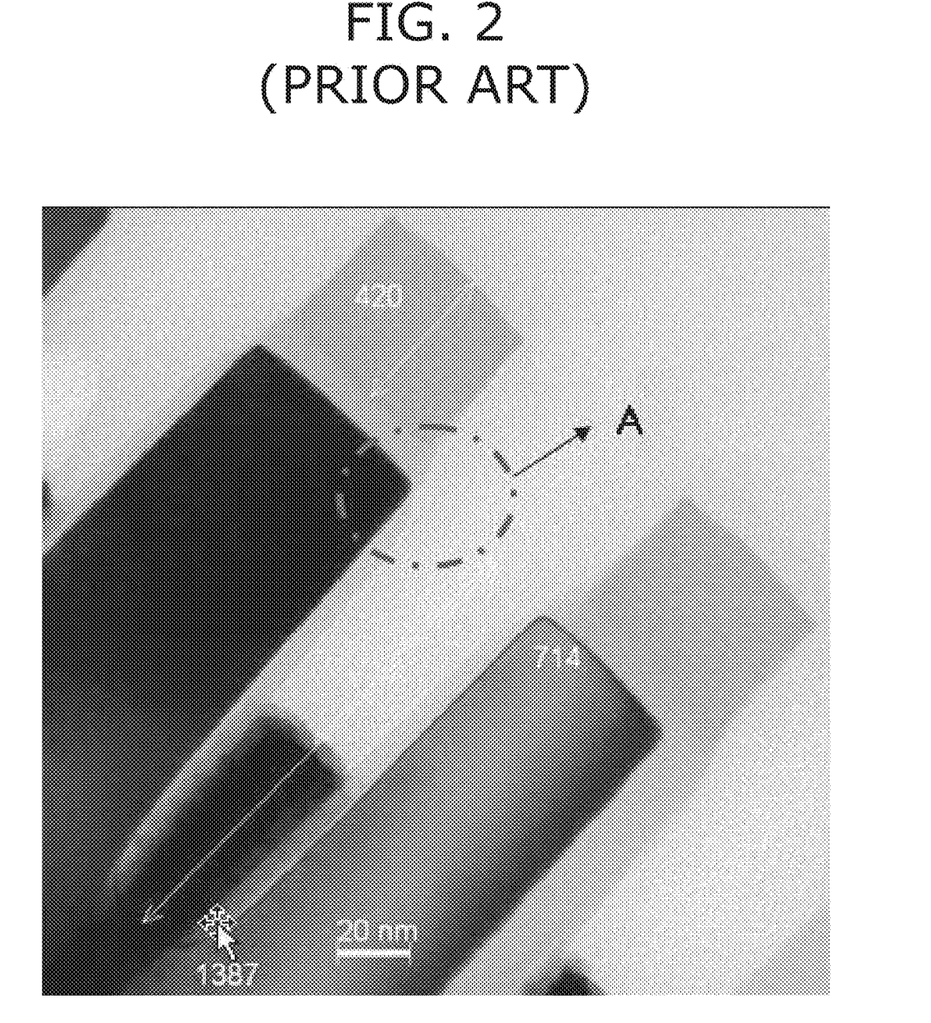
FIG. 2 is a photograph of a structure after the buried gates are formed according to the conventional technology.

FIG. 2 is a photograph of a resultant structure after the buried gates are formed according to the conventional technology. The photograph shows the gate insulation layer becoming thin at the top corner 'A' of a trench.

Plasma damage which includes the thinning of a gate insulation layer, e.g., gate oxide layer, at the top corner of a trench may be one of the factors which deteriorate the refresh characteristic.

SUMMARY OF THE INVENTION

An embodiment of the present invention is directed to a method for fabricating a semiconductor device that may reduce a damage of a gate insulation layer at the top corners of trench during a dry etch process of a gate conductive layer which is formed in a buried gate.

In accordance with an embodiment of the present invention, a method for fabricating a semiconductor device includes: forming a trench by etching a semiconductor substrate; forming a gate insulation layer over a surface of the trench; forming a gate conductive layer over the gate insulation layer; performing a first recess process by etching the gate conductive layer; forming a protection pattern over the gate insulation layer; and performing a second recess process by etching the gate conductive layer.

In accordance with another embodiment of the present invention, a method for fabricating a semiconductor device includes: forming a trench by etching a semiconductor substrate using a hard mask pattern as an etch barrier; forming a gate insulation layer on a surface of the trench; forming a gate conductive layer gap-filling the trench over the gate insulation layer; planarizing the gate conductive layer to expose a surface of the hard mask pattern; performing a first recess process by etching the gate conductive layer; forming a protection pattern for protecting the gate insulation layer at a top corner of the trench; performing a second recess process by etching the gate conductive layer to form a buried gate; and performing a post-cleaning onto the buried gate.

BRIEF DESCRIPTION OF THE DRAWINGS

FIGS. 3A to 4 are cross-sectional views describing a method for forming buried gates of a semiconductor device in accordance with an embodiment of the present invention.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 3A:
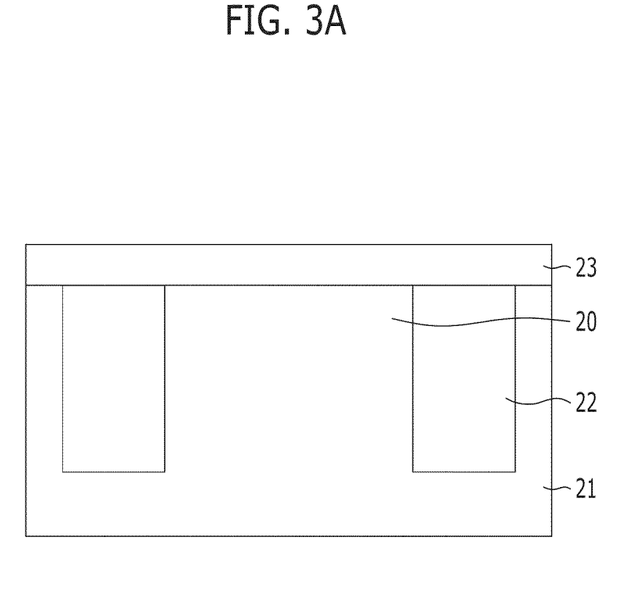
Figure 3B:
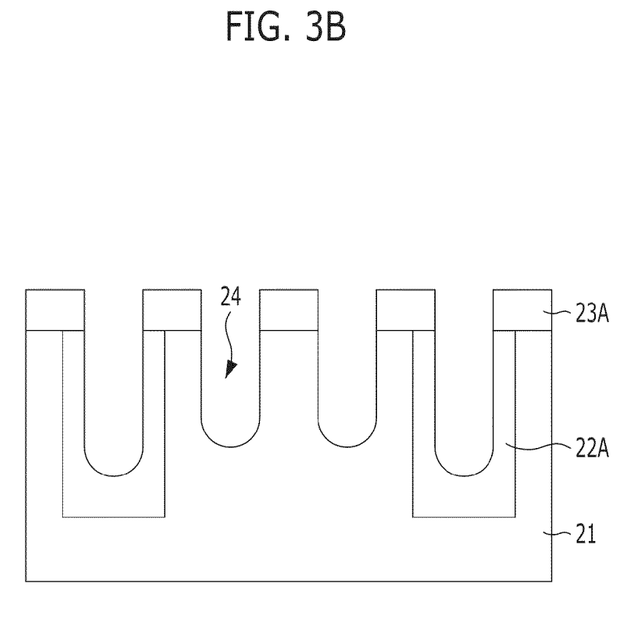
Figure 3C:
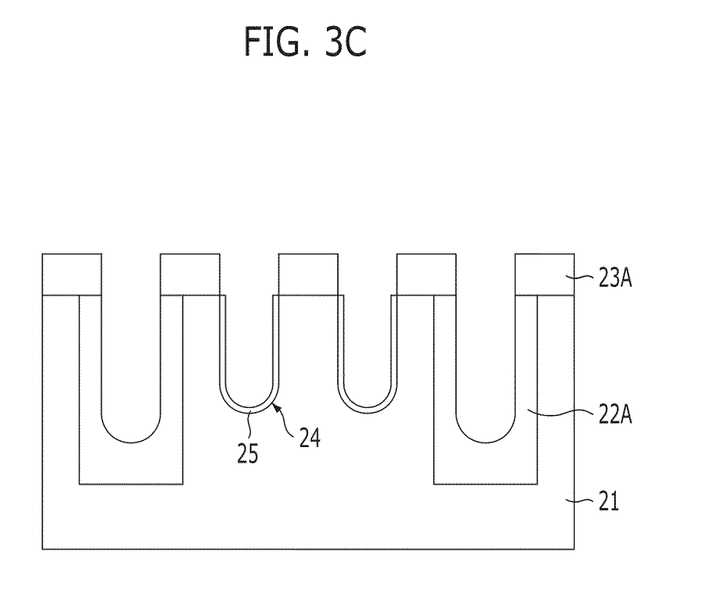
Figure 3D:
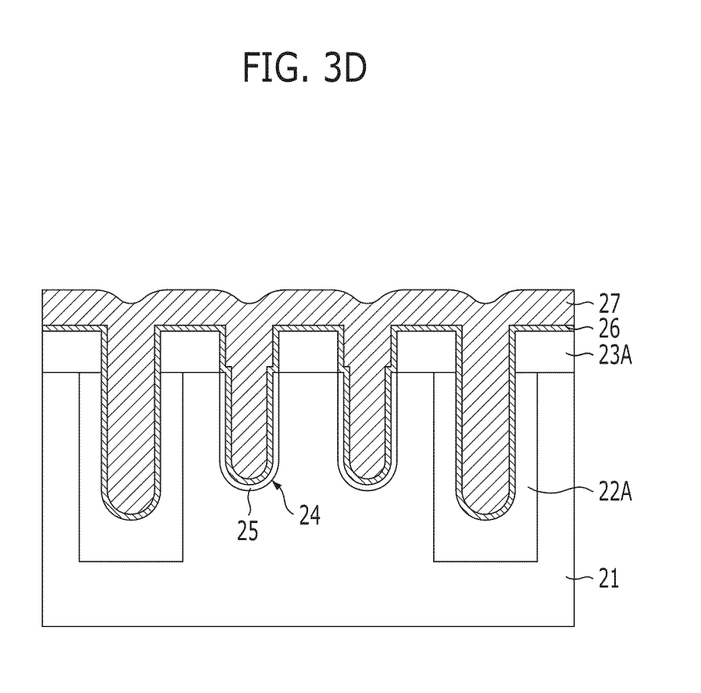
Figure 3E:
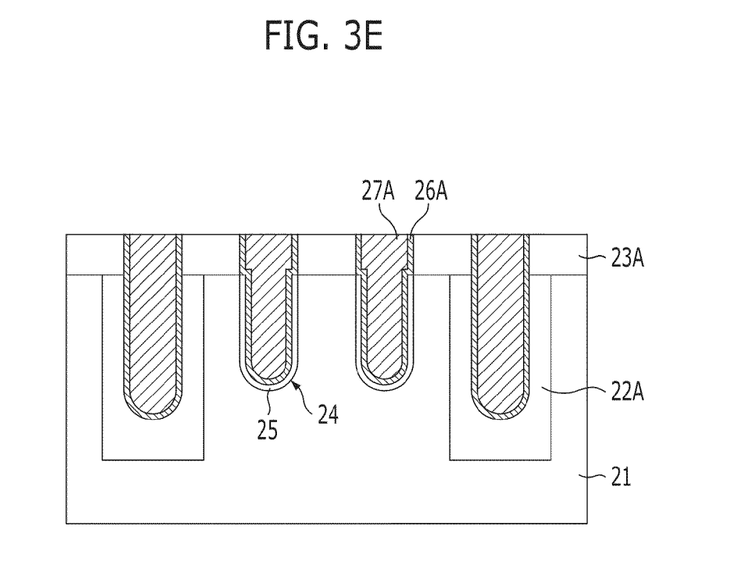
Figure 3F:
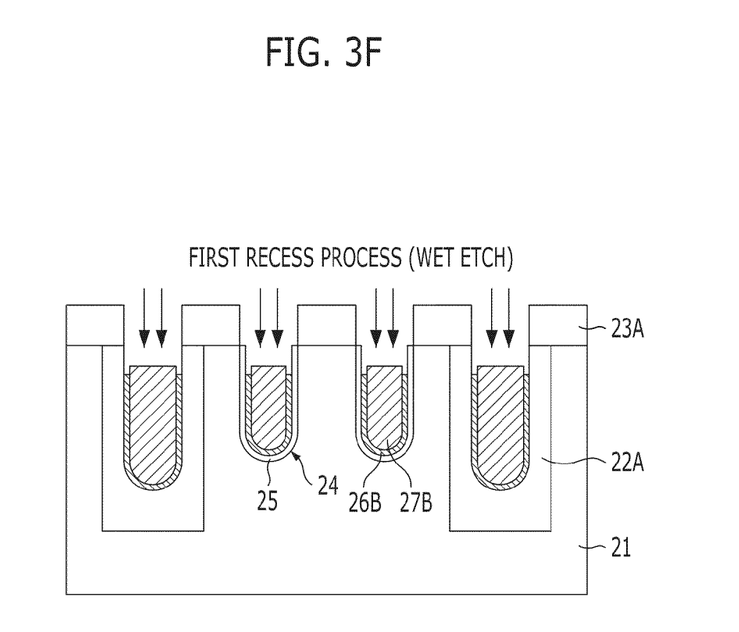
Figure 3G:
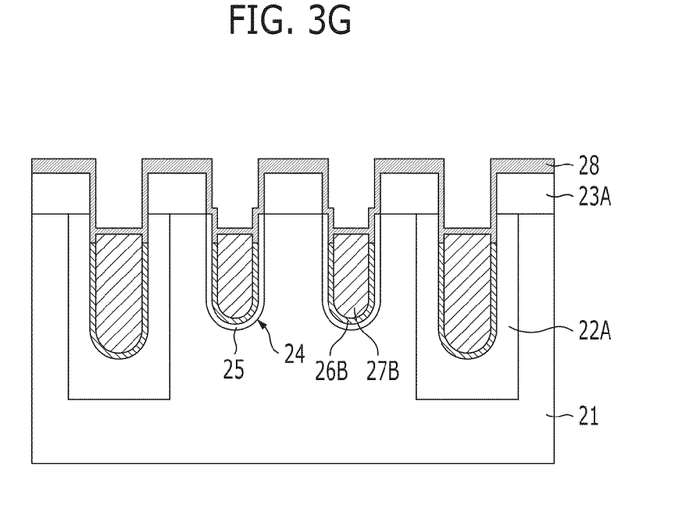
Figure 3H:
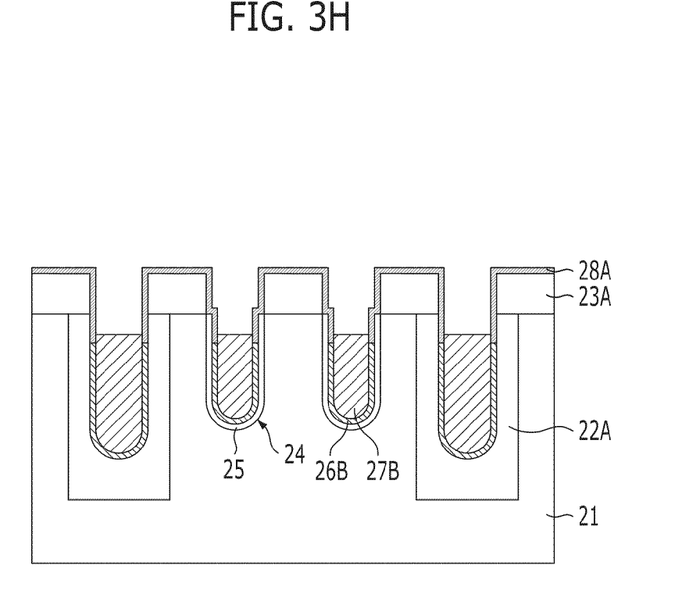
Figure 3I:
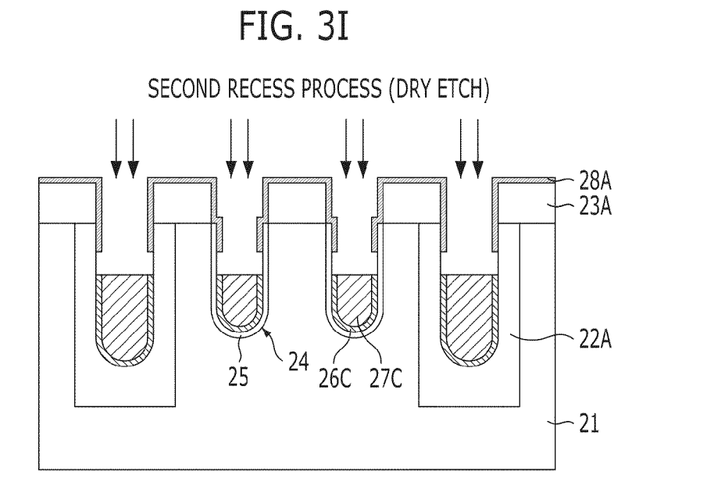
Figure 4:
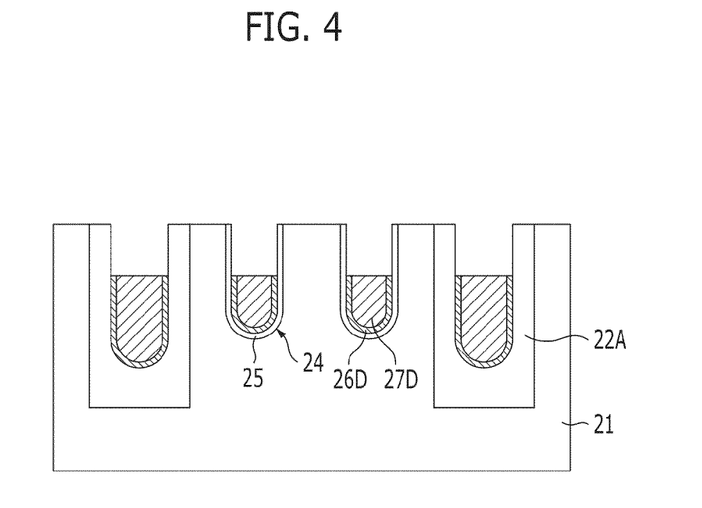

FIGS. 3A to 4 are cross-sectional views describing a method for forming buried gates of a semiconductor device in accordance with an embodiment of the present invention.

Referring to FIG. 3A, an isolation layer 22 is formed in a semiconductor substrate 21 through, for example, a shallow trench isolation (STI) process. Herein, the semiconductor substrate 21 includes a silicon substrate, and the isolation layer 22 may include an oxide layer, such as a high-density plasma (HDP) oxide layer and a spin-on dielectric (SOD) layer. The SOD layer may include a silicon oxide layer formed of polysilazane (PSZ).

Subsequently, a hard mask layer 23 is formed. Herein, the hard mask layer 23 may include a nitride layer.

Referring to FIG. 3B, the hard mask layer 23 may be etched using a buried gate mask (not shown). Hereafter, the etched hard mask layer will be referred to as a hard mask pattern 23A. Subsequently, an etch process is performed using the hard mask pattern 23A as an etch barrier to form trenches 24 where buried gates are to be formed. Here, the trenches 24 may be formed by etching not only the semiconductor substrate, e.g., an active region 20, but also the isolation layer 22. Typically, since gates are of a line-type, the trenches 24 also may be of the line-type. The line-type trenches 24 may be formed by simultaneously etching the active region 20 and the isolation layer 22. Here, since the active region 20 and the isolation layer 22 have different etch rates, the isolation layer 22 may be etched more than the active region 20, and thus the trenches in the isolation layer 22 may be deeper. Hereafter, the etched isolation layer 22 will be referred to as isolation pattern 22A.

Referring to FIG. 3C, a gate insulation layer 25 may be formed by performing an oxidation process. Here, the gate insulation layer 25 includes a silicon oxide layer, and it may be formed, for example, only on the surface of the trenches 24 of the semiconductor substrate 21.

Referring to FIG. 3D, a gate conductive layer may be deposited over the entire structure until the trenches 24 are gap-filled. The gate conductive layer may include at least any one selected from the group consisting of a tantalum nitride (TaN) layer, a titanium nitride (TiN) layer, and a tungsten (W) layer. For example, the gate conductive layer may be formed of titanium nitride (TiN) or tantalum nitride (TaN), or the gate conductive layer may be formed in a two-layer structure where a tungsten layer is stacked on a titanium nitride (TiN) layer or a tantalum nitride (TaN) layer, such as TiN/W or TaN/W. Hereafter, for purposes of illustration, it is assumed that the gate conductive layer has a stacked structure of a titanium nitride layer 26 and a tungsten layer 27. The titanium nitride layer 26 may be deposited conformally with a thickness of approximately 50 Å to 60 Å and the tungsten layer 27 may be deposited with a thickness of approximately 900 Å to 1,100 Å to gap-fill the inside of the trenches 24 over the titanium nitride layer 26.

Referring to FIG. 3E, a chemical mechanical polishing (CMP) process may be performed in such a manner that the polishing stops at the surface of the hard mask pattern 23A. Accordingly, the titanium nitride layer 26 and the tungsten layer 27 may be removed from the surface of the hard mask pattern 23A, leaving titanium nitride pattern 26A and tungsten pattern 27A filling the inside of the trenches 24.

Here, an etch-back process is not performed, and a first recess process may be performed onto the gate conductive layer through a wet etch process according to an embodiment of the present invention.

Referring to FIG. 3F, the gate conductive layer may be recessed through a wet etch process. The wet etch process may be performed using a mixed solution of sulfuric acid ($H_2SO_4$) and hydrogen peroxide ($H_2O_2$) at a mixing ratio ranging from approximately 40:1 to approximately 60:1. The wet etch process may be performed at a temperature ranging from approximately 80° C. to approximately 100° C.

When the wet etch process is performed using the mixed solution of sulfuric acid and hydrogen peroxide as described above, the titanium nitride pattern 26A and the tungsten pattern 27A may be selectively etched without damaging the hard mask pattern 23A and the gate insulation layer 25. With the wet etch process, the titanium nitride pattern 26A and the tungsten pattern 27A may be recessed approximately 100 Å to approximately 150 Å in height. The remaining titanium nitride pattern and the remaining tungsten pattern are denoted with reference numerals '26B ' and '27B,' respectively. In other words, a portion of the total recess amount for forming buried gates may be recessed through the first etch process. Here, the titanium nitride pattern 26A may be more etched than the tungsten pattern 27A by the mixed solution of sulfuric acid and hydrogen peroxide.

Referring to FIG. 3G, a protection layer 28 may be formed on a surface of the resultant structure. Here, the protection layer 28 may be formed by depositing a nitride layer in a thickness ranging from approximately 20 Å to approximately 30 Å. The protection layer 28 protects the gate insulation layer 25 during a subsequent secondary recess process.

Referring to FIG. 3H, the protection layer 28 may be selectively etched to leave a protection pattern 28A, for example, only on the sidewall and upper surface of the hard mask pattern 23A and at the top corners of each trench. The nitride layer may be etched using a mixed gas of tetrafluoromethane ($CF_4$), fluoroform ($CHF_3$), oxygen ($O_2$) and argon (Ar), and a bias power may be set to approximately 200 V to approximately 300 V. When the protection layer 28 is selectively etched, the protection layer 28 may be at least substantially removed from the surface of the remaining tungsten pattern 27B.

Referring to FIG. 3I, the remaining titanium nitride pattern 26B and the remaining tungsten pattern 27B may be recessed through a second etch process using a dry etch process, e.g., a plasma dry etch process. Herein, the recess amount of the dry etch process may be controlled to be in the range of approximately 500 Å to approximately 700 Å.

During the dry etch process, the remaining tungsten pattern 27B may be etched using a mixed gas of argon (Ar) and sulfur hexafluoride ($SF_6$) (Ar/$SF_6$), and the remaining titanium nitride pattern 26B may be etched using a mixed gas of argon (Ar), chloride ($Cl_2$) and boron trichloride ($BCl_3$). The dry etch process may be a plasma dry etch process.

After the second recess process, heights of a titanium nitride pattern 26C and a tungsten pattern 27C may be decreased from the heights obtained after the first recess process. Here, the etch rate may be controlled based on the gas used during the dry etch process and the titanium nitride pattern 26C and the tungsten pattern 27C may have the same height.

Referring to FIG. 4, the hard mask pattern 23A and the protection pattern 28A may be at least substantially removed.

Since the second recess process, e.g., the plasma dry etch process, may be performed while the protection pattern 28A covers the gate insulation layer 25 at the top corners of each trench, the gate insulation layer 25 at the top corners of each trench is not damaged by a plasma.

Figure 5A:
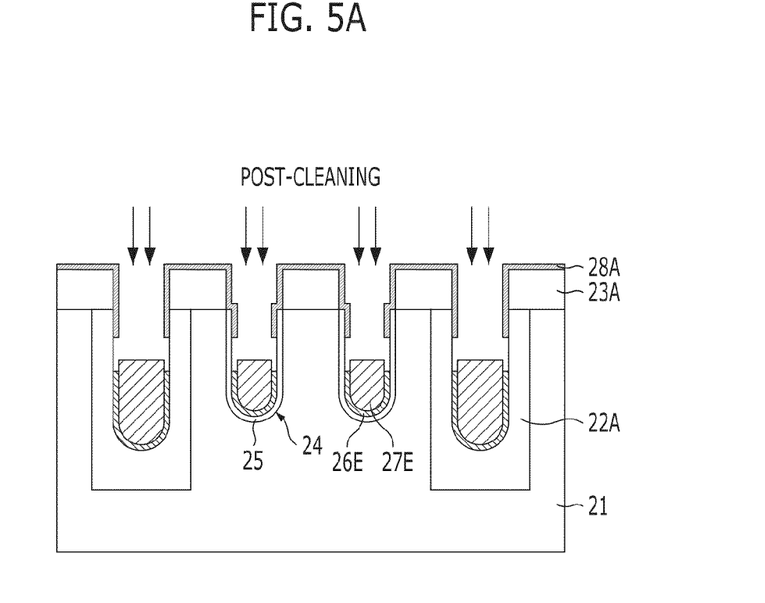
FIGS. 5A to 5B are cross-sectional views describing a method for forming buried gates of a semiconductor device in accordance with another embodiment of the present invention.

Referring to FIG. 5A, a post-cleaning may be performed after the second recess process. The etch rates of the post-cleaned titanium nitride pattern 26E and the post-cleaned tungsten pattern 27E may be controlled by the post-cleaning. In particular, the recess amount of the titanium nitride pattern 26C may be controlled to become large.

The post-cleaning process may be performed for approximately 1 minute to approximately 5 minutes by mixing the sulfuric acid ($H_2SO_4$) and the hydrogen peroxide ($H_2O_2$) at a mixing ratio ranging from approximately 40:1 to approximately 60:1. Subsequently, an additional cleaning process may be performed using a buffered oxide etchant (BOE). The cleaning process using the BOE may be performed for approximately 5 seconds to approximately 15 seconds.

When the post-cleaning is performed as described above, the etch rate of the post-cleaned tungsten pattern 27E may be slower than the etch rate of the post-cleaned titanium nitride pattern 26E. Accordingly, the post-cleaned titanium nitride pattern 26E may be etched more than the post-cleaned tungsten pattern 27E. Therefore, a height of the post-cleaned titanium nitride pattern 26E may become lower than a height of the post-cleaned tungsten pattern 27E, and thus a gap between the post-cleaned tungsten pattern 27E and the gate insulation layer 25 may be formed. As described above, since a gap is formed between the post-cleaned tungsten pattern 27E and the gate insulation layer 25, in other words, since the titanium nitride pattern is not positioned between the post-cleaned tungsten pattern 27E and the gate insulation layer 25, a gate-induced drain leakage (GIDL) effect may be reduced. Since a titanium nitride has a large work function, the post-cleaned titanium nitride pattern 26E may increase an electric field in a drain junction region of a MOSFET, and the increased electric field may induce the gate-induced drain leakage (GIDL).

Moreover, when the post-cleaning is performed using the sulfuric acid ($H_2SO_4$) and the hydrogen peroxide ($H_2O_2$), conductive materials remaining on the sidewall after the dry etch process may be removed to improve reliability.

Also, after the post-cleaning process, the height of buried gates may be maintained at least substantially uniform in all cell area, and accordingly, sheet resistance ($R_s$) variation of the buried gates may be minimized/reduced.

Figure 5B:
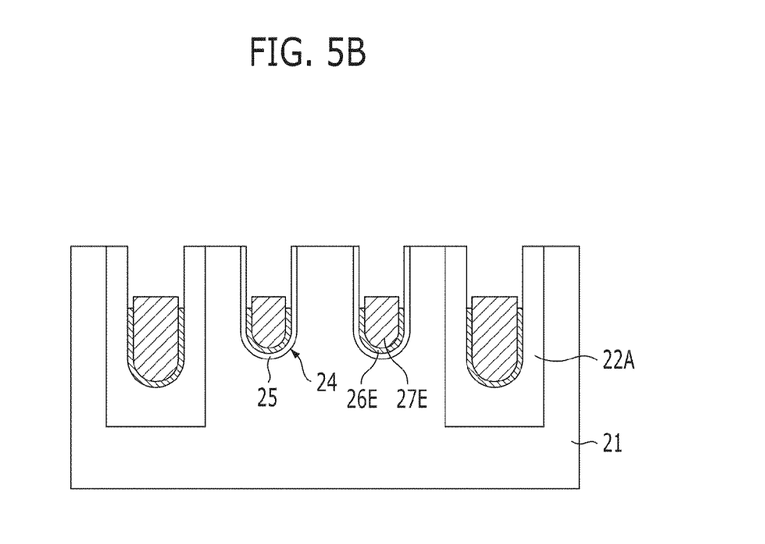

Referring to FIG. 5B, the protection pattern 28A may be selectively removed. If the protection pattern 28A is a nitride layer, it may be stripped using a solution such as phosphoric acid ($H_3PO_4$). If the hard mask pattern 23A is also a nitride layer, the hard mask pattern 23A may be simultaneously removed during the stripping process for removing the protection pattern 28A.

As described above, if the process for removing the protection pattern 28A is a wet etch process, the gate insulation layer 25 may not be damaged.

Figure 6:
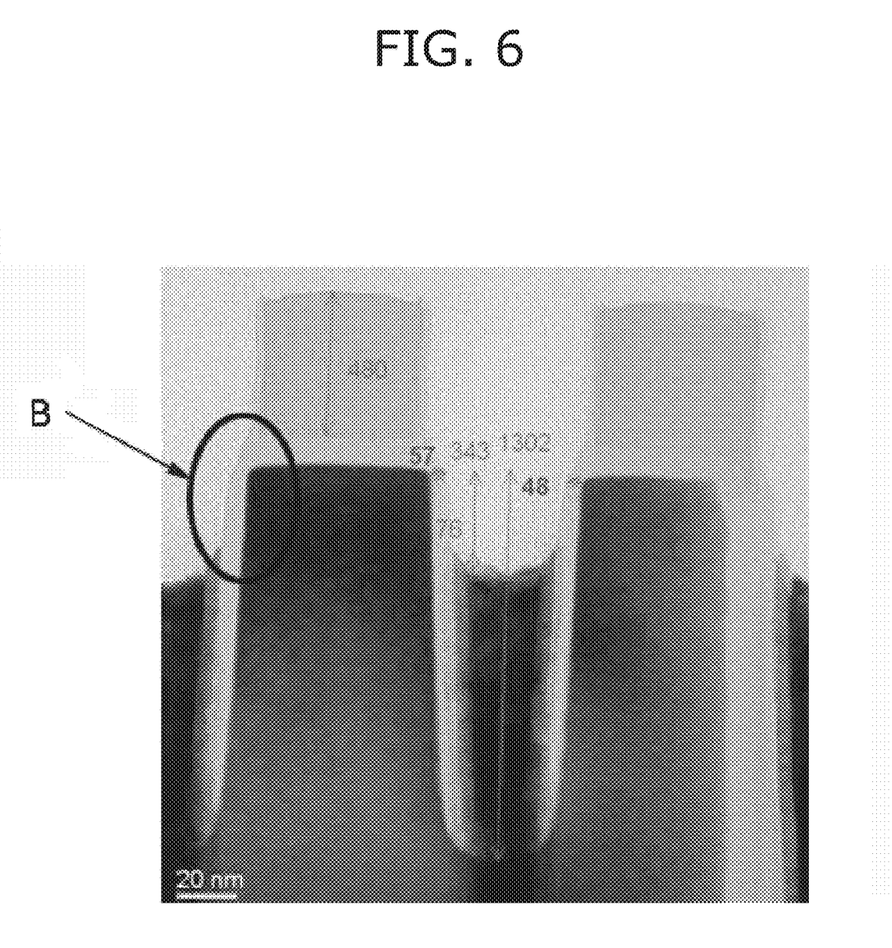
FIG. 6 is a photograph of a structure after the buried gates are formed in accordance with the embodiments of the present invention.

FIG. 6 is a photograph of a structure after the buried gates are formed in accordance with the embodiment of the present invention. It can be seen in the area denoted by the reference symbol 'B' that the gate insulation layer 25 is not damaged at the top corners of each trench and maintains a sufficient thickness.

According to the semiconductor fabrication method of the present invention described above, the recess process for forming buried gates is performed in the sequence of a first etch process and a second etch process and a protection pattern for protecting the top corners of each trench is formed between the first etch process and the second etch process. With the protection pattern, a damage of the gate insulation layer at the top corners of each trench during the second etch, for example, dry etch, may be reduced. In other words, the gate insulation layer may be protected from the plasma damage and thus a deterioration of refresh characteristic may be prevented or alleviated.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a trench by etching a semiconductor substrate;
   forming a gate insulation layer over a surface of the trench;
   forming a gate conductive layer over the gate insulation layer;
   performing a first recess process by etching the gate conductive layer;
   forming a protection pattern over the gate insulation layer; and
   performing a second recess process by etching the gate conductive layer.

2. The method of claim 1, wherein the protection pattern comprises a nitride layer.

3. The method of claim 1, wherein the forming of the protection pattern comprises:
   depositing a nitride layer over the gate conductive layer; and
   etching the nitride layer in such a manner that the nitride layer remains at the top corner of the trench and is at least substantially removed at the bottom of the trench.

4. The method of claim 3, wherein the etching of the nitride layer is performed using a mixed gas which includes tetrafluoromethane ($CF_4$), fluoroform ($CHF_3$), oxygen ($O_2$) and argon (Ar) with a bias power ranging from approximately 200 V to approximately 300 V.

5. The method of claim 3, wherein the nitride layer is formed in a thickness ranging from approximately 20 Å to approximately 30 Å.

6. The method of claim 1, wherein a recess amount of the gate conductive layer during the first recess process is controlled to be within a range of approximately 100 Å to approximately 150 Å and a recess amount of the gate conductive layer during the second recess process is controlled to be within a range of approximately 500 Å to approximately 700 Å.

7. The method of claim 1, wherein the forming the trench by etching the semiconductor substrate uses a hard mask pattern as an etch barrier.

8. The method of claim 7, further comprising:
   planarizing the gate conductive layer to expose the hard mask pattern before the first etching process.

9. The method of claim 8, wherein the stripping includes a wet etch process.

10. The method of claim 1, further comprising:
    stripping the protection pattern and the hard mask pattern after the second etching process.

11. The method of claim 1, wherein the gate conductive layer includes a titanium nitride layer and a tungsten layer.

12. The method of claim 1, wherein the first recess process is wet etch process.

13. The method of claim 1, wherein the second recess process is dry etch process.

14. The method of claim 1, further comprising:
    performing a post-cleaning after the second recess process, wherein the post-cleaning process is performed using a mixed solution prepared by mixing sulfuric acid ($H_2SO_4$) and hydrogen peroxide ($H_2O_2$) at a mixing ratio ranging from approximately 40:1 to approximately 60:1 for approximately 1 minute to approximately 5 minutes.

15. The method of claim 14, wherein an additional cleaning process is performed using a buffered oxide etchant (BOE) after the post-cleaning process performed using the mixed solution of sulfuric acid ($H_2SO_4$) and hydrogen peroxide ($H_2O_2$).

16. A method for fabricating a semiconductor device, comprising:
   forming a trench by etching a semiconductor substrate using a hard mask pattern as an etch barrier;
   forming a gate insulation layer on a surface of the trench;
   forming a gate conductive layer gap-filling the trench over the gate insulation layer;
   planarizing the gate conductive layer to expose a surface of the hard mask pattern;
   performing a first recess process by etching the gate conductive layer;
   forming a protection pattern for protecting the gate insulation layer at a top corner of the trench;
   performing a second recess process by etching the gate conductive layer to form a buried gate; and
   performing a post-cleaning onto the buried gate.

17. The method of claim 16, wherein the etching of the first recess process includes a wet etch process.

18. The method of claim 16, wherein the etching of the second recess process includes a dry etch process.

19. The method of claim 16, wherein the forming of the protection pattern comprises:
   depositing a nitride layer over a structure including the recessed gate conductive layer resulting from performing the first recess process; and
   etching the nitride layer in such a manner that the nitride layer remains at the top corner of the trench and is at least substantially removed at the bottom of the trench.

20. The method of claim 16, further comprising:
   stripping the protection pattern and the hard mask pattern after the post-cleaning process, wherein the stripping of the protection pattern includes performing a wet etch process.

* * * * *